(12) United States Patent
Takahira

(10) Patent No.: US 7,525,201 B2
(45) Date of Patent: Apr. 28, 2009

(54) SEMICONDUCTOR CHIP HAVING SOLDER BUMPS AND DUMMY BUMPS

(75) Inventor: Hidenobu Takahira, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/352,352

(22) Filed: Feb. 13, 2006

(65) Prior Publication Data

US 2006/0180928 A1 Aug. 17, 2006

(30) Foreign Application Priority Data

Feb. 14, 2005 (JP) ............................. 2005-036231

(51) Int. Cl.
*H01L 23/544* (2006.01)
(52) U.S. Cl. .................. 257/797; 257/E23.179; 257/737; 257/780; 438/401; 438/462; 437/924
(58) Field of Classification Search .......... 257/737, 257/E23.021, E23.179, E23.146, 797, 778–780, 257/786; 738/401, 462, 975, FOR. 435; 437/924
See application file for complete search history.

(56) References Cited

U.S. PATENT DOCUMENTS

| 5,289,038 | A | * | 2/1994 | Amano ..................... 257/780 |
| 6,548,827 | B2 | * | 4/2003 | Irie .......................... 257/48 |
| 6,677,677 | B2 | * | 1/2004 | Kimura et al. ............... 257/737 |
| 6,762,495 | B1 | * | 7/2004 | Reyes et al. ................. 257/737 |
| 7,126,227 | B2 | * | 10/2006 | Yamaguchi .................. 257/778 |
| 2002/0079577 | A1 | * | 6/2002 | Ho ............................ 257/737 |
| 2003/0060035 | A1 | * | 3/2003 | Kimura et al. ............... 438/626 |
| 2003/0092326 | A1 | * | 5/2003 | Nishikawa et al. .......... 439/894 |
| 2006/0055028 | A1 | * | 3/2006 | Hasunuma ................... 257/706 |

FOREIGN PATENT DOCUMENTS

| JP | 6-132353 A | 5/1994 |
| JP | 9-260429 A | 10/1997 |
| JP | 2003-017530 (A) | 1/2003 |

* cited by examiner

*Primary Examiner*—Chris C. Chu
(74) *Attorney, Agent, or Firm*—Birch, Stewart, Kolasch & Birch LLP

(57) ABSTRACT

A semiconductor chip comprises a silicon substrate on which semiconductor elements are formed, pads, each of which is formed on the silicon substrate and electrically connected to at least one of the semiconductor elements, a first insulating layer having an opening over each one of the pads, a first wiring layer formed on the first insulating layer, electrically connected to the pads and having connecting parts, a second insulating layer formed on the first wiring layer and having openings over the connecting parts of the first wiring layer, electrically functioning solder bumps, each of which is formed on one of the openings of the second insulating layer with electrically connecting to one of the pads via the first wiring layer, and dummy bumps for self adjustment, each of which is formed on one of the openings of the second insulating layer without electrically connecting to the pad.

4 Claims, 5 Drawing Sheets

SEMICONDUCTOR CHIP HAVING SOLDER BUMPS AND DUMMY BUMPS

CROSS REFERENCE TO RELATED APPLICATION

This application is based on Japanese Patent Application 2005-036231, filed on Feb. 14, 2005, the entire contents of which are incorporated herein by reference.

BACKGROUND OF THE INVENTION

A) Field of the Invention

This invention relates to a semiconductor chip, especially relates to a flip-chip mounted chip that a solder bump is formed on a silicon substrate and that is directly mounted on the substrate.

B) Description of the Related Art

It becomes necessary that a semiconductor chip is mounted in high density on the substrate by miniaturization of an electronic device using a semiconductor chip in recent years. Therefore, as shown in FIG. 6A and FIG. 6B, it is common that connecting electrodes (solder bumps) 60 are formed on a semiconductor chip 51, and the semiconductor chip 51 is directly connected to substrate lands 71 formed on a circuit substrate 70 via the solder bumps 60 by the so-called flip-chip mounting.

When the above-described semiconductor chip 51 is equipped on the circuit substrate 70, generally positioning is executed by an automatic mounting device, and the semiconductor chip 51 is mounted on the circuit substrate 70. Then for example, the semiconductor chip 51 is equipped by executing a solder reflow process of 220 to 250 degrees Celsius.

A mounting size (contacting size) between the solder bump 60 that is an electrode at the parts side and the substrate land 71 that is at the substrate side is very small such as several tens to hundreds micrometer, and there is a risk for a positioning gap.

It is suggested that the positioning gap can be corrected by self-adjustment wherein the center of the solder bump at the substrate side and the center of the solder bump at the chip side are formed shifted with each other (for example, refer to Japanese Laid-Open Patent Hei6-132353). Also, it is suggested that inclination of the chip is prevented by the reflow (for example, refer to Japanese Laid-Open Patent Hei9-250429).

Moreover, as described in the above, since the mounting size is very small, it may be broken by vibration given at a time of transportation to the next process of mounting or stress at a time of handling. Also, a mounting error may occur by a bend of the parts and substrate caused by the heat stress at a time of mounting.

SUMMARY OF THE INVENTION

It is an object of the present invention to provide a semiconductor chip that can reduce a mounting error of the semiconductor chip mounted to a circuit substrate, the semiconductor substrate having a solder bump directly formed on a silicon substrate and being mounted on the circuit substrate.

According to one aspect of the present invention, there is provided a semiconductor chip, comprising: a silicon substrate on which a plurality of semiconductor elements are formed; a plurality of pads, each of which is formed on the silicon substrate and electrically connected to at least one of the semiconductor elements; a first insulating layer having an opening over each one of the pads; a first wiring layer formed on the first insulating layer, electrically connected to the pads and having connecting parts; a second insulating layer formed on the first wiring layer and having openings over the connecting parts of the first wiring layer; electrically functioning solder bumps, each of which is formed on one of the openings of the second insulating layer with electrically connecting to one of the pads via the first wiring layer; and dummy bumps for self adjustment, each of which is formed on one of the openings of the second insulating layer without electrically connecting to the pad.

According to the present invention, a semiconductor chip that can reduce a mounting error of the semiconductor chip mounted to a circuit substrate, the semiconductor substrate having a solder bump directly formed on a silicon substrate and being mounted on the circuit substrate can be provided.

According to another aspect of the present invention, there is provide a flip chip mounting method for implementing the above-described semiconductor chip according to the one aspect of the present invention to a circuit substrate, the method comprising the steps of: (a) placing the semiconductor chip onto the circuit substrate; and (b) implementing the semiconductor chip to the circuit substrate by thermal reflowing, wherein a placing gap of the semiconductor chip and the circuit substrate at the step (a) is corrected by surface tension of the dummy bumps for self adjustment.

DETAILED DESCRIPTION OF THE PREFERRED EMBODIMENTS

Figure 1:
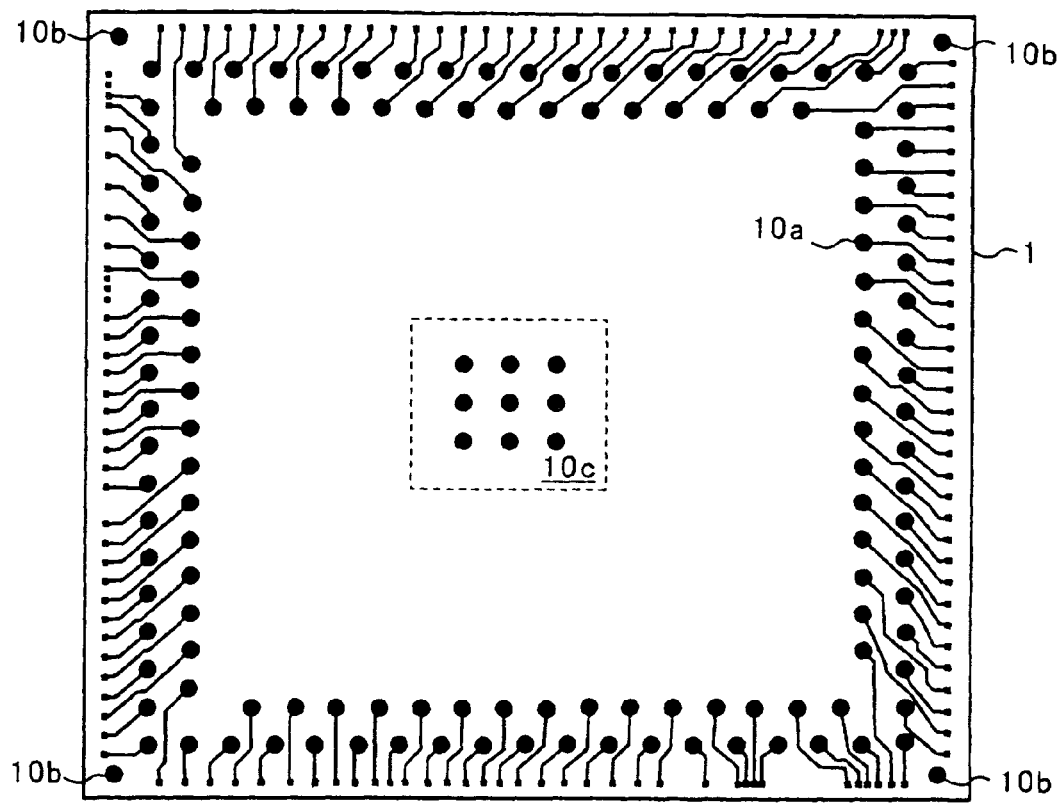
FIG. 1 is a schematic plan view showing solder bumps 10 (solder bumps 10a to 10c) formed on one surface of a semiconductor chip 1 according to an embodiment of the present invention.

FIG. 1 is a schematic plan view showing solder bumps 10 (solder bumps 10a to 10c) formed on one surface of a semiconductor chip 1 according to an embodiment of the present invention.

The solder bump (an electrode for an electric property) 10a is a necessary terminal for electronic connection with an external device such as a circuit substrate and substantially has an electronic function. That is, the solder bump 10a is a terminal connected with a pad 12 formed on a silicon substrate 11 of the semiconductor chip 1. Generally, a plurality of the electrodes for an electric property 10a are mounted around an outer periphery of the one surface of the semiconductor chip 1.

A plurality of the solder bumps (dummy solder bumps for self-adjustment) 10b are formed in unmounted (not electrically connected) spaces of four corners of the one surface of the semiconductor chip 1. The dummy solder bump for self-adjustment 10b is a terminal that is not electrically connected with the pad 12 formed on the silicon substrate 11 as described later, and mounting precision with the substrate land 21 formed on the circuit substrate 20 is self-adjusted by surface tension in a reflow mounting (refer to FIG. 3) executed by increasing a temperature by using a hot wind and infrared rays (IR).

A plurality of the solder bumps (dummy solder bumps for strength improvement) 10c are formed in the unmounted (not electrically connected) space in the center part of the one surface of the semiconductor chip 1. The dummy solder bump for strength improvement 10c is not electrically connected with the pad 12 formed over the silicon substrate 11 as described later, and a bend caused by heat stress of the circuit substrate 20 is prevented.

Moreover, both of the dummy solder bumps for self-adjustment 10b and the dummy solder bumps for strength improvement 10c can be used for an external appearance test when a mounting error is found as described later.

Figure 2:
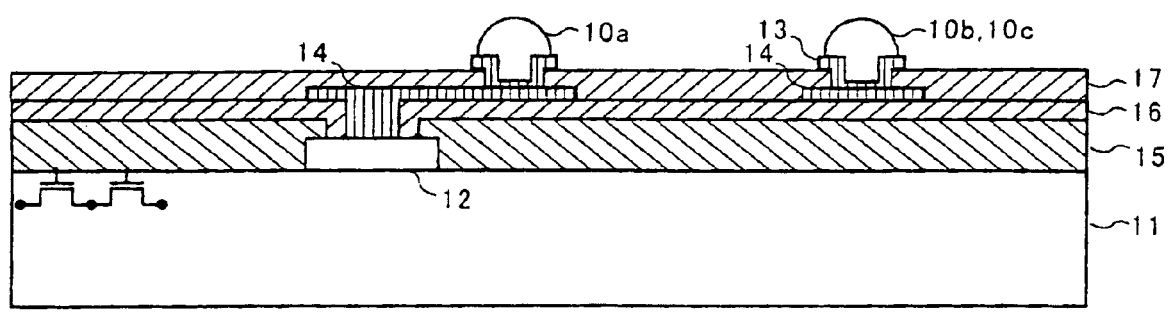
FIG. 2 is a schematic cross sectional view of the semiconductor chip 1 showing a structure of the solder bumps 10a to 10c according to the embodiment of the present invention.

FIG. 2 is a schematic cross sectional view of the semiconductor chip 1 showing a structure of the solder bumps 10a to 10c according to the embodiment of the present invention.

The semiconductor chip 1 is a semiconductor integrated circuit such as a digital signal processor (DSP), a semiconductor memory, an image sensor and the like which is manufactured by forming a plurality of semiconductor elements on a silicon substrate. The solder-bumps 10a to 10c are positioned on the one surface of the semiconductor chip according to the embodiment of the present invention.

Each solder-bump 10a is a necessary terminal for electronic connection and substantially has an electronic function. It is connected via the pad unit 12 made of Aluminum (Al), etc., the electrode 13 made of Titanium (Ti), Tungsten (W) and Copper (Cu), etc., and a wiring layer 14 formed on the semiconductor substrate 11.

An insulating layer 15 made of silicon nitride (SiN) and having openings and a first protecting or insulating film 16 made of polyimide are formed on the semiconductor substrate 11. At least a part of the pad 12 is exposed through the openings, and the wiring layer 14 is connected to the pad 12 via the openings. A second protecting or insulating film 17 having openings is formed on the first protecting or insulating film 16 to cover the wiring layer 14, and a part of the wiring layer 14 is exposed thorough the openings where the electrodes 13 are formed on the exposed region. The solder bump 10a are arranged on the electrodes 13.

The solder bumps 10b and 10c (the dummy solder bumps for self-adjustment 10b and the dummy solder bumps for strength improvement 10c) are unnecessary terminal for the electric property and are not connected with the pad 12 formed on the semiconductor substrate 11. The solder bumps 10b and 10c can be positioned if the electrodes 13 are formed on the protecting or insulating film 17; however, the wiring layer 14 has thickness of several thousands angstroms, and flatness cannot be kept if the wiring layer 14 is omitted.

Therefore, in the embodiment of the present invention, the wiring layer 14 is formed under the electrodes 13 positioning under the solder bumps 10b and 10c as same as those positioning under the solder bumps 10a in order to maintain the same co-planarity as the solder bumps 10a. By doing that, the flatness of the one surface of the semiconductor chip 1 can be improved, and the height of the solder bumps 10a to 10c can be made even. Moreover, the solder bumps 10a to 10c have diameters of about 100 μm.

FIG. 3A to FIG. 3E are diagrams for explaining self-adjustment of positioning gap according to the embodiment of the present invention.

Figure 3A:
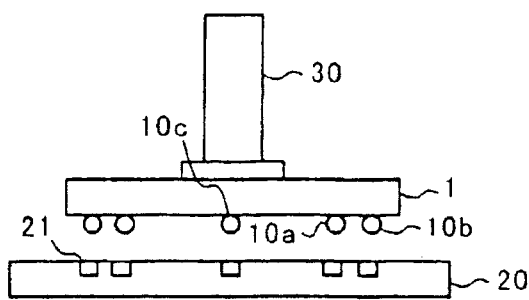
FIG. 3A to FIG. 3E are diagrams for explaining self-correction of a positioning gap according to the embodiment of the present invention.
Figure 3B:
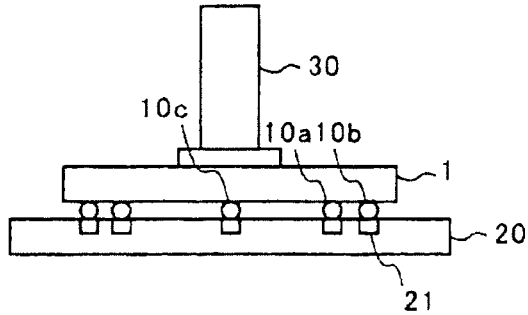
Figure 3C:
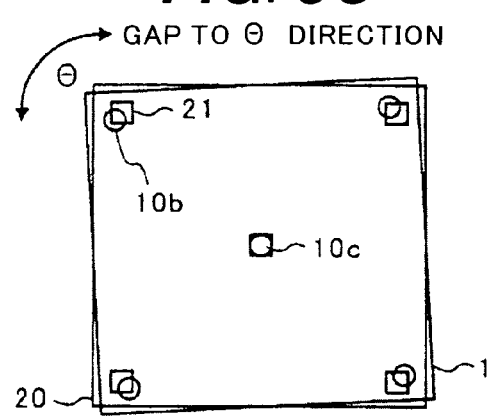

First, as shown in FIG. 3A, a backside of the semiconductor chip 1 is absorbed by the auto mount or (automatic mounting device) 30, and it is mounted on the circuit substrate 20 as shown in FIG. 3B. At this time, the positioning gap to θ direction may occur. Moreover, the positioning gap to θ direction becomes large from the center part to the outer periphery of the semiconductor chip, and the positioning gap does not occur in the center part. Moreover, the substrate lands 21 are formed by a printing wiring or the like on the position corresponding to the solder bumps 10a to 10c formed on the semiconductor chip 1.

Figure 3D:
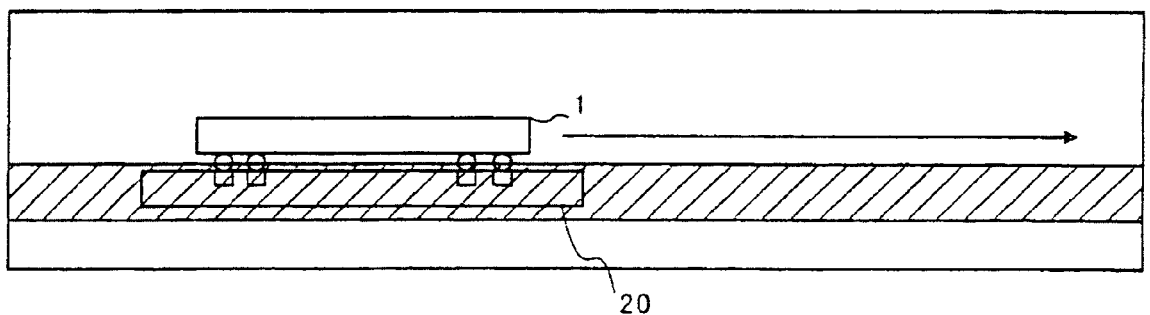

Next, as shown in FIG. 3D, the solder reflow is executed on the semiconductor chip 1 that has been mounted on this circuit substrate 20 and has a positioning gap to θ direction. It is executed by giving heat of 220 to 260 degrees Celsius by using heat wind or infrared rays (IR). By that, the semiconductor chip 1 and the circuit substrate 20 are adhered via the solder bumps 10, etc.

Figure 3E:
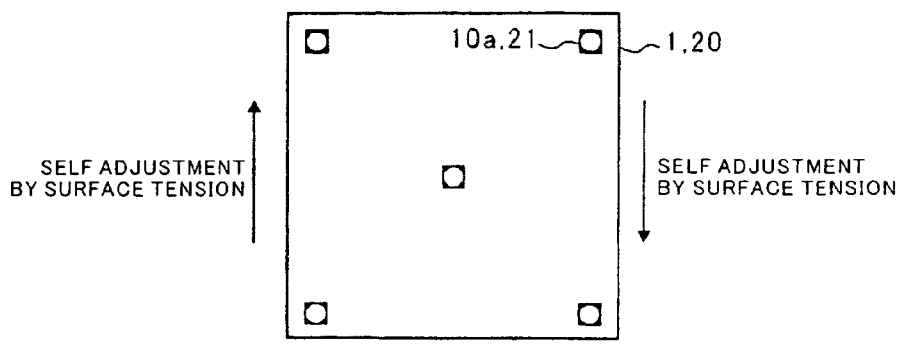

Since the dummy solder bumps 10b are positioned on the outer periphery (e.g., the four corners) of the semiconductor chip 1 in the embodiment of the present invention, the positioning gap to θ direction can be self-adjusted as shown in FIG. 3E by surface tension to adhere the solder bumps 10b to the substrate lands 21 if the gap to θ direction is less than the diameter of the solder bumps 10b. Moreover, the solder bumps 10b can be positioned not only at the four corners of the semiconductor chip 1 but other areas of the outer periphery. As described in the above, since the positioning gap to θ direction gets large to the outer periphery, the maximum self-adjustment effect of the mounting precision (positioning gap) can be obtained by positioning the solder bumps 10b at the four corners of the semiconductor chip 1.

Moreover, the solder bumps 10b show the self-adjustment effect using the surface tension to the direction other than θ direction. Also, the solder bumps 10c positioned in the center does not work for the positioning gap to θ direction; however, they show the self-adjustment effect to the positioning gap to lengthwise and crosswise directions by the surface tension. In this case, the solder bumps 10c work as the dummy bumps for self-adjustment.

Figure 4A:
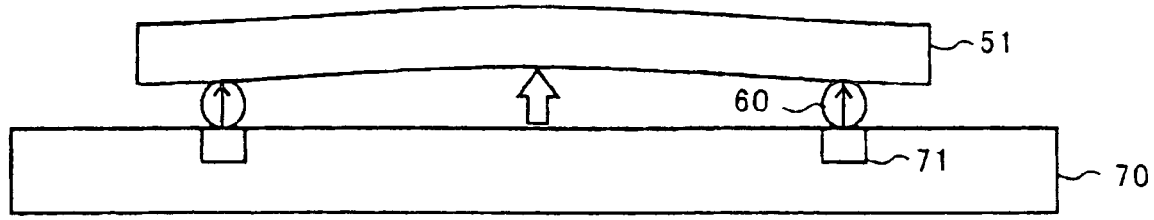
FIG. 4A and FIG. 4B are diagrams for explaining improvement in a mounting strength to the circuit substrate 20 according to the embodiment of the present invention.

FIG. 4A is a diagram showing a mounting error that may occur when a conventional semiconductor chip 51 is mounted on a circuit substrate 70. In FIG. 4A, a mounting size between the parts side electrodes (solder bumps) 60 and the substrate side electrodes (substrate lands) 71 is very small such as several tens to hundreds micrometers, and the mounting error may occur by various factors. For example, a bend may occur on a thin semiconductor chip 51 by a heat stress by reflow at a time of reflow process as shown in FIG. 4A. Then the bend affects on the solder bumps 60, and the electric connection between the semiconductor chip 51 and the circuit substrate 70 by the solder bumps may be broken. Also, it is considered that the mounting error (breakage) between the large-sized semiconductor chip and the circuit substrate 70 may be occurred by a vibration after the mounting and a stress at a time of transportation to the next process.

Figure 4B:
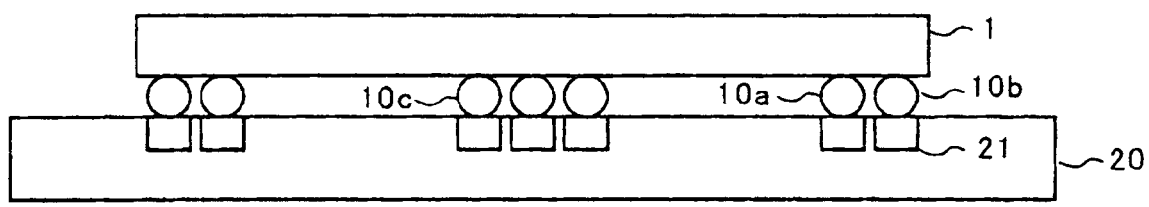

FIG. 4B is a diagram for explaining improvement in the mounting strength to the circuit substrate 20 according to the embodiment of the present invention. In the embodiment of the present invention, the solder-bumps 10c for improving mounting strength are positioned in the center part of the semiconductor chip 1, and the solder-bumps 10c are joined with the substrate lands 21b that are formed on the circuit substrate 20 side without an electronic function. Then, the mounting strength between the semiconductor chip 1 and the circuit substrate 20 is improved. Therefore, the bend of the semiconductor chip 1 by the reflow at a time of mounting can be prevented, and breakage of electronic contact between the semiconductor chip 1 and the circuit substrate 20 can be prevented or at least decreased.

Since the mounting strength is improved by the solder-bumps 10c for improving mounting strength, the mounting nonconformity caused by the vibration after mounting or stress at a time of transportation to the next step can be prevented or at least decreased.

Moreover, under the solder bumps 10c for the improvement of the mounting strength in the embodiment of the present invention, the wiring layer 14 is formed under the electrodes 13 without electric function similar to that formed under the solder bumps 10a having an electric function described in the above; therefore, the flatness is secured, and it has the same co-planarity as the solder bumps 10a having the electric function.

Although the bend of the semiconductor chip has been shown in FIG. 4A, there is possibility that the circuit substrate will bend. The embodiment of the present invention is also effective for that case by adjoining the semiconductor chip 1 and the circuit substrate 20 in the center. Also, if the embodiment is limited to the purpose of the improvement in the mounting strength, the solder bumps 10b positioned at the outer periphery of the semiconductor chip 1 can be omitted.

Figure 5A:
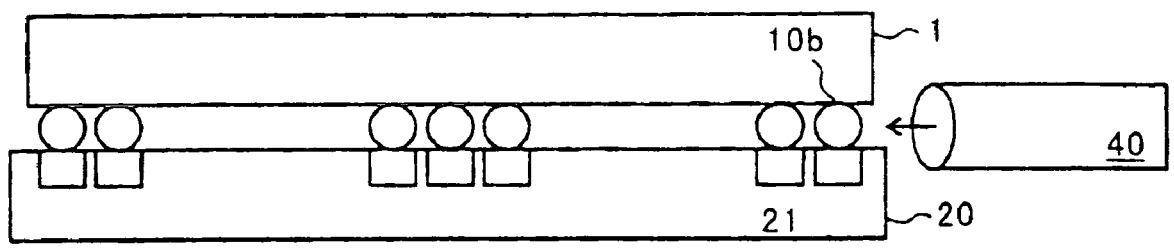
FIG. 5A and FIG. 5B are diagrams for explaining an inspection method of a mounting error of the semiconductor chip 1 according to the embodiment of the present invention
Figure 5B:
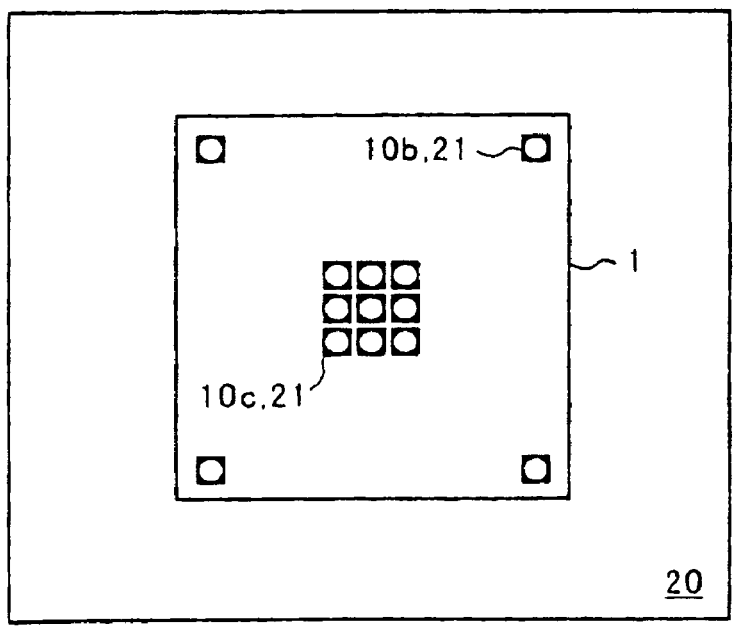
Figure 6A:
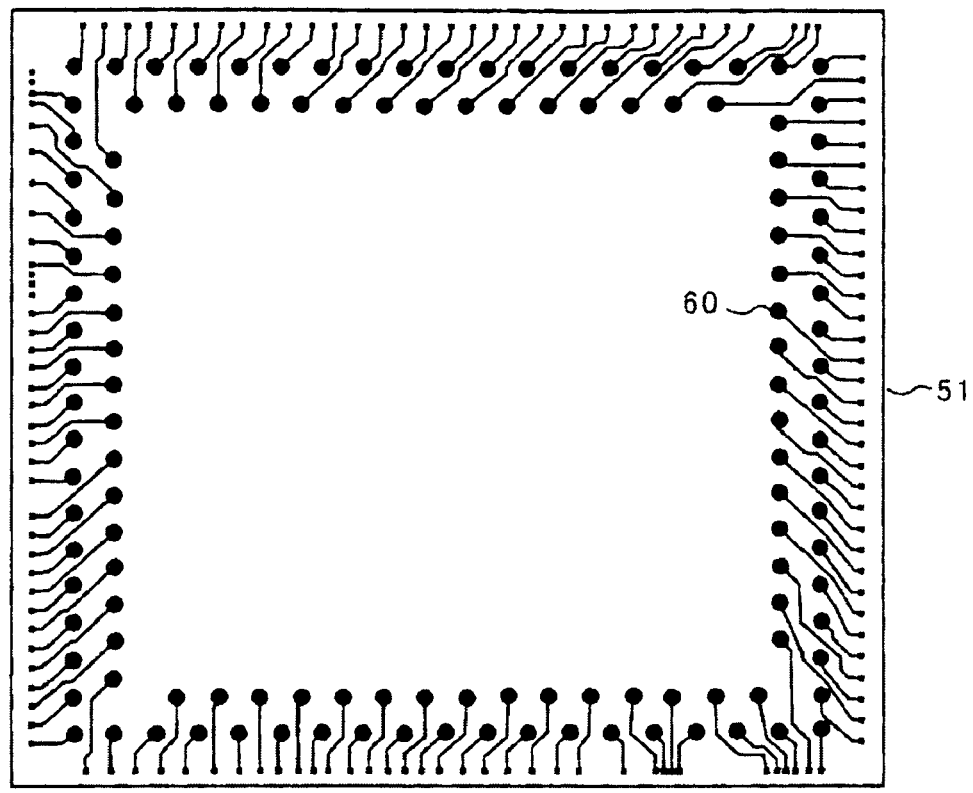
FIG. 6A and FIG. 6B are a schematic plan view showing a solder bump 60 formed on one surface of a conventional semiconductor chip 51 and a diagram showing mounted state to a circuit substrate 70.
Figure 6B:
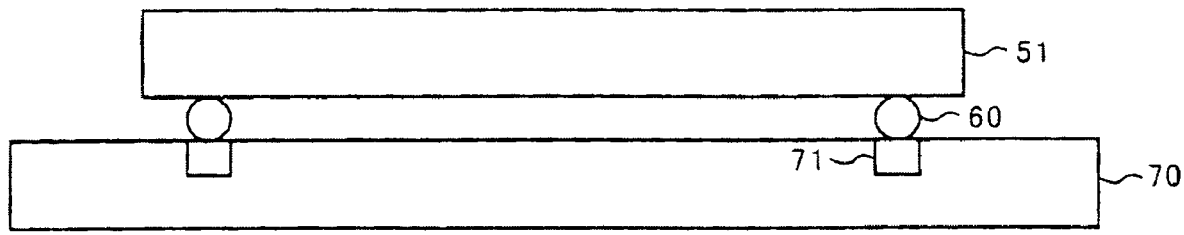

FIG. 5A and FIG. 5B are diagrams for explaining an inspection method of a mounting error of the semiconductor chip 1 according to the embodiment of the present invention FIG. 5A shows an external appearance test by using a microscope. In a case of a mounting angle gap (gap to θ direction) of the semiconductor chip 1 and the circuit substrate 20 in the mounting error caused by the positioning gap of the semiconductor chip 1, the gap of the solder bumps 10b positioned at the four corners (or in the outer periphery) of the semiconductor chip 1 and the substrate land 21 is observed by the external appearance test by using the microscope in order to specify a cause of the error. Moreover, as described in the above, the reason for executing the external appearance test to the outer peripheral area is because the influence of the gap to θ direction becomes large to the outer periphery.

FIG. 5B shows the external appearance test by using an X-ray. In a case of the mounting angle gap to longitudinal and transverse directions of the semiconductor chip 1 and the circuit substrate 20, in addition to the above-described external appearance test of the solder bumps 10b, the solder bumps 10c positioned at the unmounted space at the center of the semiconductor chip 1 are observed with an X-ray to inspect the gap of the solder bumps 10c and the substrate lands 21. Since the solder bumps 10c are positioned at the unmounted space at the center, precise X-ray analysis can be executed by back-gliding the reverse surface of the one surface having the solder bumps 10 formed of the semiconductor chip 1 at the time of the X-ray observation.

As described in the above, according to the embodiment of the present invention, the mounting angle gap (gap to θ direction) and the gap to longitudinal and transverse directions of the semiconductor chip 1 and the circuit substrate 20 can be self-adjusted by the solder bumps (the dummy bumps for self-adjustment) 10b positioned at four corners (or the outer periphery) of the semiconductor chip 1.

Also, according to the embodiment of the present invention, the gap in longitudinal and transverse directions of the semiconductor chip 1 and the circuit substrate 20 can be self-adjusted by the solder bumps 10c (the dummy solder bumps for strength improvement positioned in the center of the semiconductor chip 1.

Moreover, according to the embodiment of the present invention, inspection resolution at the time of occurrence of a mounting error can be improved by the solder bumps (the dummy solder bumps for self-adjustment) 10b, and the analysis of the mounting error by a non-destructive inspection can be executed.

Moreover, according to the embodiment of the present invention, inspection resolution at the time of occurrence of a mounting error can be improved by the solder bumps (the dummy solder bumps for strength improvement) 10c positioned in the center of the semiconductor chip 1, and analysis of the mounting error by a non-destructive inspection can be executed.

Moreover, according to the embodiment of the present invention, the mounting strength can be improved by the solder bumps (the dummy bumps for improvement in the mounting strength) 10c positioned in the unmounted (not electrically connected) space in the center of the semiconductor chip 1.

Also, according to the embodiments of the present invention, the flatness can be improved by forming the wiring layer 14 under the solder bumps (dummy solder bumps for self-adjustment) and the solder bumps (the dummy solder bumps for improvement in the mounting strength) as same as the solder bumps (the electrodes for an electric property) 10a. Therefore, co-planarity of the solder bumps (the solder bumps for self-adjustment) 10b and the dummy solder bumps for improvement in the mounting strength) 10c to the circuit substrate 20 can be obtained as same as the solder bumps (the electrodes for an electric property) 10a.

Moreover, according to the embodiment of the present invention, although the case that the solder bumps (the solder bumps for self-adjustment) 10b are positioned at all four corners of the semiconductor chip 1 has been explained, they may be positioned at two or three corners of four corners.

The present invention has been described in connection with the preferred embodiments. The invention is not limited only to the above embodiments. It is apparent that various modifications, improvements, combinations, and the like can be made by those skilled in the art.

What are claimed are:

1. A semiconductor chip, comprising:

a silicon substrate on which a plurality of semiconductor elements are formed;

a plurality of pads, each of which is formed on the silicon substrate and electrically connected to at least one of the semiconductor elements;

a first insulating layer having an opening over each one of the pads;

a first wiring layer formed on the first insulating layer, electrically connected to the pads and having connecting parts;

a second insulating layer formed on the first wiring layer and having openings over the connecting parts of the first wiring layer;

electrically functioning solder bumps, each of which is formed on one of the openings of the second insulating layer with electrically connecting to one of the pads via the first wiring layer; and dummy bumps for self adjustment positioned on at least two of four corners at outer side of the pads in outermost periphery of the chip and at the center part of the silicon substrate, each of which is formed on one of the openings of the second insulating layer without electrically connecting to the pad.

2. The semiconductor chip according to claim 1, further comprising a second wiring layer formed below the dummy bumps for self adjustment on a same surface level as the first wiring layer and electrically disconnected to the pads.

3. The semiconductor chip according to claim 1, wherein a layer structure under the dummy bumps is the same as a layer structure under the electrically functioning solder bumps.

4. The semiconductor chip according to claim 1, wherein a layer structure under the dummy bumps and a layer structure under the electrically functioning solder bumps are simultaneously formed at the same process.

* * * * *